(12) United States Patent
Xia

(10) Patent No.: US 11,665,919 B2
(45) Date of Patent: May 30, 2023

(54) DISPLAY PANEL, MANUFACTURING METHOD THEREOF, AND INTELLIGENT TERMINAL

(71) Applicant: WUHAN CHINA STAR OPTOELECTRONICS SEMICONDUCTOR DISPLAY TECHNOLOGY CO., LTD., Wuhan (CN)

(72) Inventor: Cunjun Xia, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 216 days.

(21) Appl. No.: 16/623,103

(22) PCT Filed: Sep. 10, 2019

(86) PCT No.: PCT/CN2019/105189
§ 371 (c)(1),
(2) Date: Dec. 16, 2019

(87) PCT Pub. No.: WO2020/232915
PCT Pub. Date: Nov. 26, 2020

(65) Prior Publication Data
US 2021/0336183 A1    Oct. 28, 2021

(30) Foreign Application Priority Data

May 22, 2019   (CN) .......................... 201910428685.2

(51) Int. Cl.
*H10K 50/813*   (2023.01)
*H01L 51/52*    (2006.01)
(Continued)

(52) U.S. Cl.
CPC ...... *H01L 51/5209* (2013.01); *H01L 27/3234* (2013.01); *H01L 27/3246* (2013.01);
(Continued)

(58) Field of Classification Search
None
See application file for complete search history.

(56) References Cited

U.S. PATENT DOCUMENTS

2010/0052519 A1*  3/2010  Jeon ................. H01L 51/5281
                                                 313/504
2014/0319477 A1* 10/2014  Kim ................. H01L 27/3246
                                                 257/40
(Continued)

FOREIGN PATENT DOCUMENTS

CN     106847872 A    6/2017
CN     107946341 A    4/2018
(Continued)

*Primary Examiner* — Nishath Yasmeen
(74) *Attorney, Agent, or Firm* — PV IP PC; Wei Te Chung; Zhigang Ma

(57) ABSTRACT

The present invention provides a display panel, a manufacturing method of the display panel, and an intelligent terminal. The display panel has a photosensitive region for placing a photosensor of a camera. The display panel includes: an array substrate; and anodes disposed on the array substrate. The photosensitive region is arranged on one side of the array substrate away from the anodes, and the anode which is arranged corresponding to the photosensitive region has a patterned structure.

8 Claims, 3 Drawing Sheets

(51) Int. Cl.
  *H01L 27/32*   (2006.01)
  *H01L 51/56*   (2006.01)
  *H10K 59/65*   (2023.01)
  *H10K 59/122*  (2023.01)
  *H10K 71/00*   (2023.01)
  *H10K 50/818*  (2023.01)
  *H10K 59/12*   (2023.01)

(52) U.S. Cl.
  CPC .......... *H01L 51/56* (2013.01); *H01L 51/5218* (2013.01); *H01L 2227/323* (2013.01)

(56) References Cited

U.S. PATENT DOCUMENTS

| | | | |
|---|---|---|---|
| 2015/0364527 A1* | 12/2015 | Wang | H01L 27/3244 257/40 |
| 2016/0202575 A1* | 7/2016 | Youk | G02F 1/136286 349/110 |
| 2016/0315133 A1* | 10/2016 | Sato | H01L 27/3213 |
| 2017/0287992 A1* | 10/2017 | Kwak | G06F 1/1652 |
| 2018/0190748 A1* | 7/2018 | Im | H01L 27/326 |
| 2018/0225500 A1* | 8/2018 | Han | H01L 27/3218 |
| 2018/0276444 A1 | 9/2018 | Sun et al. | |
| 2019/0131580 A1 | 5/2019 | Youn et al. | |
| 2019/0140031 A1 | 5/2019 | Lamkin et al. | |
| 2020/0251539 A1* | 8/2020 | Fu | H01L 27/3216 |

FOREIGN PATENT DOCUMENTS

| | | |
|---|---|---|
| CN | 109728186 A | 5/2019 |
| CN | 109786432 A | 5/2019 |
| CN | 109801950 A | 5/2019 |

\* cited by examiner

DISPLAY PANEL, MANUFACTURING METHOD THEREOF, AND INTELLIGENT TERMINAL

1. FIELD OF DISCLOSURE

The present invention relates to a field of display devices and in particular, to a display panel, a manufacturing method thereof, and an intelligent terminal.

2. DESCRIPTION OF RELATED ART

Compared with liquid crystal displays, active matrix organic light emitting diode (AMOLED) displays have advantages of high contrast, wide viewing angles, and fast response speed for moving images, and are increasingly used in smartphone screens. In order to maximize visual effects, full-screen smartphones are developed.

At present, a camera in the full-screen smart phone is generally placed under a screen (CUP), but a base polyimide (PI) film layer of the display screen, a metal film layer in an array layer, an anode, an organic functional film layer, a cathode, a thin film encapsulation layer, and a polarizing film affect light transmission through the screen, wherein the PI film layer, the anode, and the polarizing film affect the light transmission most seriously, resulting in poor photosensitive effects of the under-screen camera.

SUMMARY

The present invention provides a display panel to solve the problem of poor light transmission efficiency of conventional displays.

The present invention provides a display panel, comprising a photosensitive region for disposing a photosensor of a camera, wherein the display panel comprises:

an array substrate; and a plurality of anodes disposed on the array substrate;

wherein the photosensitive region is disposed on one side of the array substrate away from the anodes, and the anode which is disposed corresponding to the photosensitive region comprises a patterned structure.

The display panel further comprises a pixel definition layer disposed on the array substrate and the anodes, and a protrusion structure is arranged on a surface of the pixel definition layer corresponding to the photosensitive region.

The patterned structure comprises a fan-blade shaped structure.

The protrusion structure comprises at least one sphere-shaped protrusion.

The display panel further comprises a polarizing film disposed at one side of the pixel definition layer away from the array substrate, and the polarizing film comprises a hollow region disposed corresponding to the photosensitive region.

The display panel further comprises an organic functional layer and an encapsulation layer, the organic functional layer is disposed on the pixel definition layer and the anodes, the encapsulation layer is disposed on the organic functional layer, and the polarizing film is disposed on the encapsulation layer.

The present invention further provides an intelligent terminal, comprising:

a camera and a display panel, wherein the display panel comprises a photosensitive region, a photosensor of the camera is disposed in the photosensitive region, and the display panel comprises:

an array substrate; and a plurality of anodes disposed on the array substrate;

wherein the photosensitive region is disposed on one side of the array substrate away from the anodes, and the anode which is disposed corresponding to the photosensitive region comprises a patterned structure.

The display panel further comprises a pixel definition layer disposed on the array substrate and the anodes, and a protrusion structure is arranged on a surface of the pixel definition layer corresponding to the photosensitive region.

The patterned structure comprises a fan-blade shaped structure.

The protrusion structure comprises at least one sphere-shaped protrusion.

The display panel further comprises a polarizing film disposed at one side of the pixel definition layer away from the array substrate, and the polarizing film comprises a hollow region disposed corresponding to the photosensitive region.

The display panel further comprises an organic functional layer and an encapsulation layer, the organic functional layer is disposed on the pixel definition layer and the anodes, the encapsulation layer is disposed on the organic functional layer, and the polarizing film is disposed on the encapsulation layer.

The present invention further provides a manufacturing method of a display panel, comprising steps as follows:

providing an array substrate;

forming a plurality of anodes on the array substrate, wherein the array substrate is provided with a photosensitive region for disposing a photosensor of a camera at one side away from the anodes; and patterning the anode which is disposed corresponding to the photosensitive region.

The method further comprises:

forming a pixel definition layer on the array substrate and the anodes; and forming a protrusion structure on a surface of the pixel definition layer corresponding to the photosensitive region.

The method further comprises:

forming a polarizing film at one side of the pixel definition layer away from the array substrate; and removing a portion of the polarizing film disposed corresponding to the photosensitive region.

Advantages of the present invention: The display panel of the present embodiment provides the photosensitive region for disposing the photosensor of the camera at a bottom of the array substrate, and the anode arranged corresponding to the photosensitive region has the patterned structure to increase a light transmissive area at the anode, improve light transmission of the display panel, and increase an amount of light reaching the photosensitive region. The pixel definition layer is provided with the protrusion structure on the surface of the pixel definition layer corresponding to the photosensitive region, so that light having a large deviation angle can be transmitted into the photosensitive region, thereby further improving light transmission of the display panel. The portion of the polarizing film corresponding to the position of the photosensitive region is the hollow region to maximize the amount of light reaching the photosensitive region.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DETAILED DESCRIPTION OF EMBODIMENTS

Figure 1:
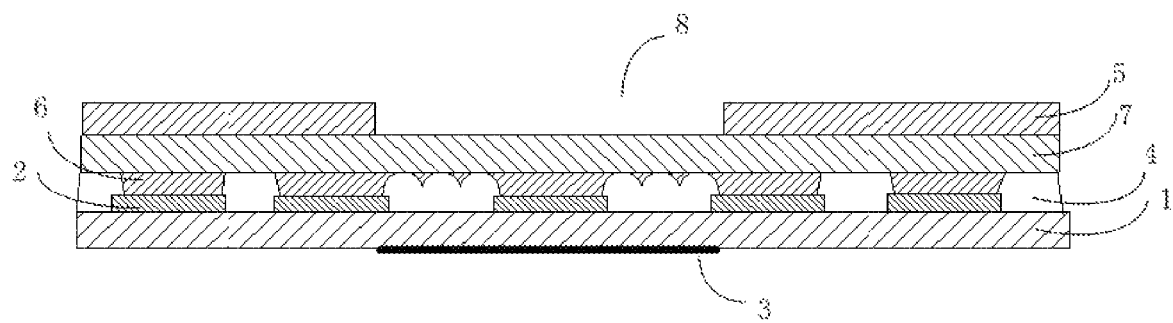
FIG. 1 is a schematic structural view illustrating a display panel according to one embodiment of the present invention.

The present invention is described below with reference to the accompanying drawings, in which embodiments of the present invention are provided for fully describing the technical contents of the present invention for ease of understanding. However, the present invention may be embodied in many different forms of embodiments, and the protection scope of the present invention is not limited to the embodiments set forth herein.

The terms used in the description of the present invention are intended to describe particular embodiments only and are not intended to describe the whole concept of the present invention. Expressions used in the singular forms encompasses the plural forms of expressions unless otherwise specified. In the following description of the present invention, it should be noted that terms such as "comprise", "include", and "contain", are intended to indicate presence of features, numbers, steps, actions, or combinations thereof, but are not intended to rule out the possibility that one or more other features, numbers, steps, actions, or combinations may be added. The same reference numerals in the drawings denote the same parts.

Please refer to FIG. 1, which is a schematic structural view illustrating a display panel according to one embodiment of the present invention.

As shown in FIG. 1, the present invention provides a display panel, comprising a photosensitive region 3 for disposing a photosensor of a camera, wherein the display panel comprises an array substrate 1 and a plurality of anodes 2. The anodes 2 are disposed on the array substrate 1. The photosensitive region 3 is disposed on one side of the array substrate 1 away from the anodes 2. In other words, the photosensitive region 3 is disposed on a bottom of the array substrate 1. In details, the photosensitive region 3 can be disposed on a surface of the bottom of the array substrate 1, that is, the photosensor of the camera can be disposed on the surface of the bottom of the array substrate 1; alternatively, the photosensitive region 3 can be a recess of the bottom of the array substrate 1, that is, the photosensor of the camera is disposed in the recess of the bottom of the array substrate 1, thus thinning the array substrate 1 in a position corresponding to the photosensor of the camera and increasing an amount of light reaching the photosensor of the camera.

Each anode 2 includes an indium tin oxide (ITO) film, silver (Ag), and an ITO film stacked one above the other. Silver (Ag) has a light reflecting function, so the anodes 2 have extremely low light transmission. In solution, the anode 2 arranged corresponding to the photosensitive region 3 is patterned, so that the anode 2 arranged corresponding to the photosensitive region 3 has a patterned structure to increase a light transmissive area of the anode 2 arranged corresponding to the photosensitive region 3, thus improving light transmission of the display panel and increasing an amount of light reaching the photosensitive region.

Figure 2:
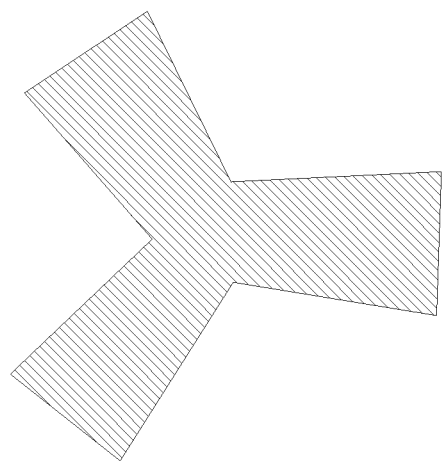
FIG. 2 is a schematic structural view illustrating a patterned structure of an anode of the display panel according to one embodiment of the present invention.
Figure 3:
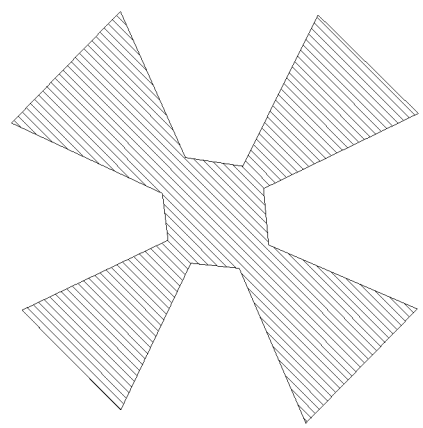
FIG. 3 is another schematic structural view illustrating the patterned structure of the anode of the display panel according to one embodiment of the present invention.
Figure 4:
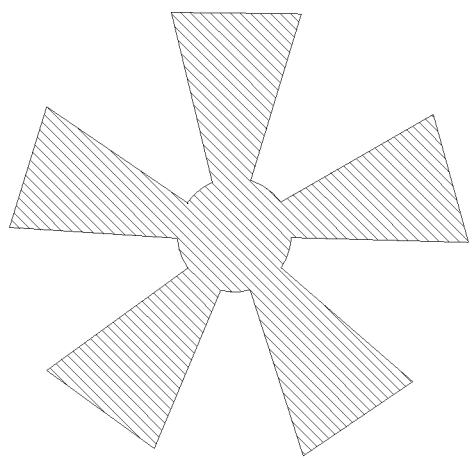
FIG. 4 is still another schematic structural view illustrating the patterned structure of the anode of the display panel according to one embodiment of the present invention.

The anodes 2 on the array substrate 1 can be produced by physical vapor deposition, and the patterned structure of the anode 2 can be made by photolithography techniques like coating, exposure, and development. The patterned structure of the anode 2 can be a fan-blade shaped structure which is, for example, a three-fan-blade structure as shown in FIG. 2, a four-fan-blade structure as shown in FIG. 3, a five-fan-blade structure as shown in FIG. 4. The patterned structure of the anode 2 can be a structure of other shapes, as long as these shapes can increase the light transmissive area of the anode 2; and the present invention is not limited in this regard.

Furthermore, as shown in FIG. 1, the display panel further comprises a pixel definition layer 4 disposed on the array substrate 1 and the anodes 2, and a protrusion structure is arranged on a surface of the pixel definition layer 4 corresponding to the photosensitive region 3. In the present embodiment, the protrusion structure is disposed on the surface of the pixel definition layer 4 corresponding to the photosensitive region 3, so that light having a large deviation angle is transmitted into the photosensitive region 3 to further improve light transmission of the display panel.

Figure 5:
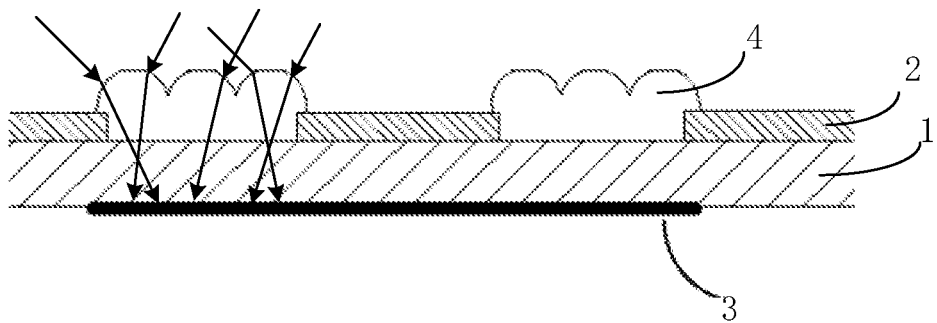
FIG. 5 is a schematic view illustrating an operating principle of the display panel according to one embodiment of the present invention.

The patterned structure of the anode 2 can be made by photolithography techniques like coating, exposure, and development. The protrusion structure on the surface of the pixel definition layer 4 comprises at least one sphere-shaped protrusion. As shown in FIG. 5, light is refracted into the photosensitive region 3 after being irradiated to the sphere-shaped protrusion to increase an amount of light in the photosensitive region 3.

Furthermore, the display panel further comprises a polarizing film 5 disposed at one side of the pixel definition layer 4 away from the array substrate 1, and the polarizing film 5 comprises a hollow region 8 disposed corresponding to the photosensitive region 3. Since the polarizing film 5 filters out about 50% of the light, the polarizing film 5 is hollowed out in a region corresponding to a position of the photosensitive region 3. That is, a portion of the polarizing film 5 corresponding to a position of the photosensitive region 3 is removed, so as to maximize the amount of light reaching the photosensitive region 3.

The display panel further comprises an organic functional layer 6 and an encapsulation layer 7. The organic functional layer 6 is disposed on the pixel definition layer 4 and the anodes 2, the encapsulation layer 7 is disposed on the organic functional layer 6, and the polarizing film 5 is disposed on the encapsulation layer 7.

It should be noted that, after the pixel definition layer 4 is produced, the organic functional layer 6 and the encapsulation layer 7 are sequentially produced by a process like thermal evaporation, chemical vapor deposition (CVD), or inkjet printing. Then, the polarizing film is attached onto the encapsulation layer 7. After that, a portion of the polarizing film 5 corresponding to the position of the photosensitive region 3 is removed.

Further, the array substrate 1 includes a base substrate and a thin film transistor layer disposed on the base substrate. The photosensitive region 3 is disposed on a side of the base substrate away from the thin film transistor layer, and the anode 2 is disposed on a side of the thin film transistor layer away from the base substrate.

The thin film transistor layer includes a buffer layer, an active layer, a gate insulating layer, a gate electrode, an interlayer insulating layer, a source/drain electrode, and a planarization layer. Specifically, the buffer layer in the thin film transistor layer is disposed on the base substrate, the active layer is disposed on the buffer layer, the gate insulating layer is disposed on the buffer layer and the active layer, and the gate electrode is disposed on the gate insulating layer. The interlayer insulating layer is disposed on the gate insulating layer and the gate electrode, the source/drain electrode is disposed on the interlayer insulating layer, and the planarization layer is disposed on the interlayer insulating layer and the source/drain electrode. The anode 2 is disposed on the planarization layer and the source/drain electrode in the thin film transistor layer to be electrically connected to the source/drain electrode in the thin film transistor layer.

In light of the above, the display panel of the present embodiment provides the photosensitive region for disposing the photosensor of the camera at a bottom of the array substrate, and the anode arranged corresponding to the photosensitive region has the patterned structure to increase a light transmissive area at the anode, improve light transmission of the display panel, and increase the amount of light reaching the photosensitive region. The pixel definition layer is provided with the protrusion structure on the surface of the pixel definition layer corresponding to the photosensitive region, so that light having a large deviation angle is transmitted into the photosensitive region, thereby further improving the light transmission of the display panel. The portion of the polarizing film corresponding to the position of the photosensitive region is the hollow region to maximize the amount of light reaching the photosensitive region.

Figure 6:
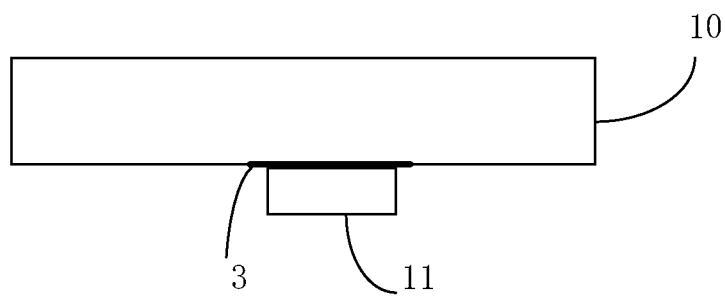
FIG. 6 is a schematic structural view illustrating an intelligent terminal according to one embodiment of the present invention.

FIG. 6 is a schematic structural view illustrating an intelligent terminal according to one embodiment of the present invention.

As shown in FIG. 6, the intelligent terminal of the present embodiment comprises a camera and a display panel 10. A photosensor 11 of the camera is disposed in a photosensitive region 3 of the display panel 10. The display panel 10 is the display panel of the above-mentioned embodiment, so a detailed description is omitted herein for brevity.

In this embodiment, the photosensor 11 of the camera is disposed in the photosensitive region 3 at a bottom of the display panel 10. By increasing the amount of light reaching the photosensitive region 3, the amount of light reaching the photosensor 11 of the camera is increased, photosensitive functions of the camera are improved, and thereby a full-screen intelligent terminal can be realized.

Figure 7:
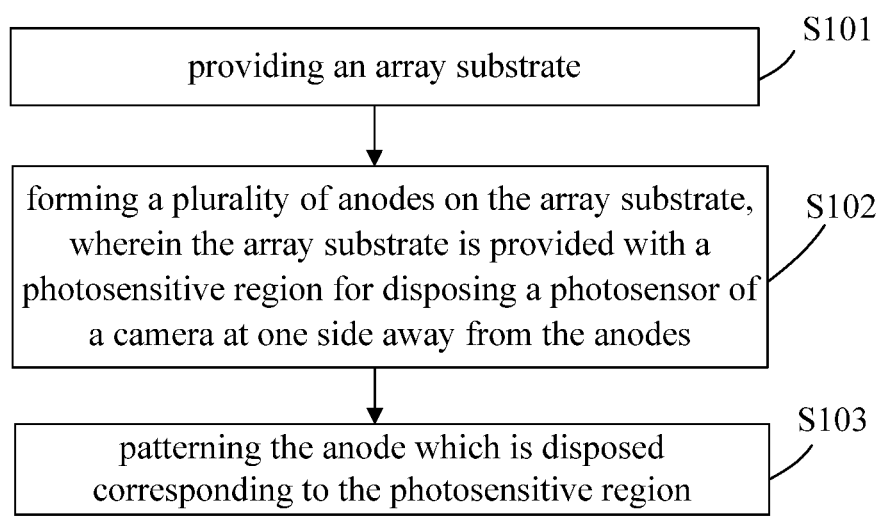
FIG. 7 is a process flow diagram illustrating a manufacturing method of the display panel according to one embodiment of the present invention.

FIG. 7 is a process flow diagram illustrating a manufacturing method of the display panel according to one embodiment of the present invention.

As shown in FIG. 7, the manufacturing method of the display panel comprises steps as follows: Step 101: providing an array substrate. The array substrate comprises a base substrate and a thin film transistor layer disposed on the base substrate. Step 102: forming a plurality of anodes on the array substrate, wherein the array substrate is provided with a photosensitive region for disposing a photosensor of a camera at one side away from the anodes.

As shown in FIG. 1, the photosensitive region 3 is disposed on a bottom of the array substrate 1. In other words, the photosensor of the camera can be disposed on the surface of the bottom of the array substrate 1; alternatively, the photosensitive region 3 can be a recess of the bottom of the array substrate 1, that is, the photosensor of the camera is disposed in the recess of the bottom of the array substrate 1, thus thinning the array substrate 1 in a position corresponding to the photosensor of the camera and increasing the amount of light reaching the photosensor of the camera. The anode 2 on the array substrate 1 can be produced by physical vapor deposition.

step S103: patterning the anode which is disposed corresponding to the photosensitive region.

As shown in FIG. 1, the anode 2 disposed corresponding to the photosensitive region 3 has a patterned structure. The patterned structure of the anode 2 can be made by photolithography techniques like coating, exposure, and development. The patterned structure of the anode 2 can be a fan-blade shaped structure which is, for example, a three-fan-blade structure as shown in FIG. 2, a four-fan-blade structure as shown in FIG. 3, and a five-fan-blade structure as shown in FIG. 4. The patterned structure of the anode 2 can be a structure of other shapes, as long as these shapes can increase a light transmissive area of the anode 2; and the present invention is not limited in this regard.

The anodes 2 have a light reflecting function, so have extremely low light transmission. In solution, the anode 2 arranged corresponding to the photosensitive region 3 is patterned, so that the anode 2 arranged corresponding to the photosensitive region 3 has a patterned structure to increase the light transmissive area of the anode 2 arranged corresponding to the photosensitive region 3, thus improving light transmission of the display panel and increasing the amount of light reaching the photosensitive region 3.

Furthermore, the manufacturing method further comprises: forming a pixel definition layer on the array substrate and the anodes; and forming a protrusion structure on a surface of the pixel definition layer corresponding to the photosensitive region.

Referring to FIG. 1, the pixel definition layer 4 is disposed on the array substrate 1 and the anodes 2, and the protrusion structure is arranged on the surface of the pixel definition layer 4 corresponding to the photosensitive region 3. The protrusion structure can be produced by photolithography techniques like coating, exposure, and development. The protrusion structure of the surface of the pixel definition layer 4 comprises at least one sphere-shaped protrusion. In the present embodiment, the protrusion structure is disposed on the surface of the pixel definition layer 4 corresponding to the position of the photosensitive region 3, so that light having a large deviation angle is transmitted into the photosensitive region 3 to further improve light transmission of the display panel.

The manufacturing method further comprises: forming a polarizing film at one side of the pixel definition layer away from the array substrate; and removing a portion of the polarizing film disposed corresponding to the photosensitive region.

As shown in FIG. 1, a polarizing film 5 disposed at one side of the pixel definition layer 4 away from the array substrate 1. A portion of the polarizing film 5 disposed corresponding to the photosensitive region 3 is hollowed out to form a hollow region 8. Since the polarizing film 5 filters out about 50% of the light, the portion of the polarizing film 5 in a region corresponding to the photosensitive region 3 is removed to maximize the amount of light reaching the photosensitive region 3.

In summary, in the manufacturing method of the display panel, the photosensitive region for disposing the photosensor of the camera is disposed at a bottom of the array substrate, and the anode arranged corresponding to the position of the photosensitive region has the patterned structure to increase the light transmissive area of the anode, improve light transmission of the display panel, and increase the amount of light reaching the photosensitive region. The pixel definition layer is provided with the protrusion structure on the surface of the pixel definition layer corresponding to the position of the photosensitive region, so that light having a large deviation angle is transmitted into the photosensitive region, thereby further improving light transmission of the display panel. The portion of the polarizing film corresponding to the position of the photosensitive region is the hollow region to maximize the amount of light reaching the photosensitive region.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A display panel, comprising a photosensitive area for disposing a photosensor of a camera, wherein the display panel comprises:
    an array substrate;
    a plurality of anodes disposed on the array substrate;
    a pixel definition layer disposed on the array substrate and the anodes, wherein a surface of the pixel definition layer is provided with a protrusion structure disposed above the photosensitive area; and
    a polarizing film disposed at one side of the pixel definition layer away from the array substrate, the polarizing film comprising an opening defined in a position above the protrusion structure and the photosensitive area, wherein the opening is defined in the polarizing film and extending through a whole thickness of the polarizing film, and the protrusion structure is disposed between the opening and the photosensitive area;
    wherein the photosensitive area is disposed on one side of the array substrate away from the anodes, an orthogonal projection of the photosensitive area projected on the array substrate covers or coincides with an orthogonal projection of the opening projected on the array substrate, and the orthogonal projection of the opening projected on the array substrate covers an orthogonal projection of the protrusion structure projected on the array substrate; and
    wherein the anode which is disposed above the photosensitive area comprises a patterned structure.

2. The display panel according to claim 1, wherein the patterned structure comprises a fan-blade shaped structure.

3. The display panel according to claim 1, wherein the protrusion structure comprises at least one sphere-shaped protrusion.

4. The display panel according to claim 1, wherein the display panel further comprises an organic functional layer and an encapsulation layer, the organic functional layer is disposed on the pixel definition layer and the anodes, the encapsulation layer is disposed on the organic functional layer, and the polarizing film is disposed on the encapsulation layer.

5. An intelligent terminal, comprising:
    a camera and a display panel,
    wherein the display panel comprises a photosensitive area, a photosensor of the camera is disposed in the photosensitive area, and the display panel comprises:
        an array substrate;
        a plurality of anodes disposed on the array substrate;
        a pixel definition layer disposed on the array substrate and the anodes, wherein a surface of the pixel definition layer is provided with a protrusion structure disposed above the photosensitive area; and
        a polarizing film disposed at one side of the pixel definition layer away from the array substrate, the polarizing film comprising an opening defined in a position above the protrusion structure and the photosensitive area, wherein the opening is defined in the polarizing film and extending through a whole thickness of the polarizing film, and the protrusion structure is disposed between the hollow region opening and the photosensitive area;
    wherein the photosensitive area is disposed on one side of the array substrate away from the anodes, an orthogonal projection of the photosensitive area projected on the array substrate covers or coincides with an orthogonal projection of the opening projected on the array substrate, and the orthogonal projection of the opening projected on the array substrate covers an orthogonal projection of the protrusion structure projected on the array substrate; and
    wherein the anode which is disposed above the photosensitive area comprises a patterned structure.

6. The intelligent terminal according to claim 5, wherein the patterned structure comprises a fan-blade shaped structure.

7. The intelligent terminal according to claim 5, wherein the protrusion structure comprises at least one sphere-shaped protrusion.

8. The intelligent terminal according to claim 5, wherein the display panel further comprises an organic functional layer and an encapsulation layer, the organic functional layer is disposed on the pixel definition layer and the anodes, the encapsulation layer is disposed on the organic functional layer, and the polarizing film is disposed on the encapsulation layer.

* * * * *